(12) United States Patent
Jung et al.

(10) Patent No.: US 11,955,155 B2
(45) Date of Patent: Apr. 9, 2024

(54) NONVOLATILE MEMORY DEVICE AND LATCH INCLUDING THE SAME

(71) Applicant: UIF (University Industry Foundation), Yonsei University, Seoul (KR)

(72) Inventors: Seong Ook Jung, Seoul (KR); Se Keon Kim, Seoul (KR); Tae Woo Oh, Seoul (KR); Se Hee Lim, Seoul (KR); Dong Han Ko, Seoul (KR)

(73) Assignee: UIF (UNIVERSITY INDUSTRY FOUNDATION), YONSEI UNIVERSITY, Seoul (KR)

( * ) Notice: Subject to any disclaimer, the term of this patent is extended or adjusted under 35 U.S.C. 154(b) by 115 days.

(21) Appl. No.: 17/588,180

(22) Filed: Jan. 28, 2022

(65) Prior Publication Data

US 2022/0254398 A1  Aug. 11, 2022

(30) Foreign Application Priority Data

Feb. 9, 2021 (KR) .................. 10-2021-0018040
Feb. 9, 2021 (KR) .................. 10-2021-0018041

(51) Int. Cl.
- *G11C 11/22* (2006.01)
- *G11C 7/10* (2006.01)
- *H03K 19/017* (2006.01)
- *H03K 19/20* (2006.01)

(52) U.S. Cl.
CPC ........ *G11C 11/2273* (2013.01); *G11C 7/1039* (2013.01); *G11C 11/2275* (2013.01); *G11C 11/2297* (2013.01); *H03K 19/01742* (2013.01); *H03K 19/20* (2013.01)

(58) Field of Classification Search
CPC .... G11C 5/06; G11C 7/12; G11C 7/14; G11C 11/2273; G11C 7/1039; G11C 11/2275; G11C 11/2297
USPC ................................................... 365/185.21
See application file for complete search history.

(56) References Cited

U.S. PATENT DOCUMENTS

| | | | |
|---|---|---|---|
| 10,832,761 B2* | 11/2020 | Morris | H10B 10/00 |
| 2018/0114560 A1* | 4/2018 | Kim | G11C 11/5607 |
| 2018/0330791 A1* | 11/2018 | Li | G11C 13/0061 |
| 2019/0213119 A1* | 7/2019 | Yang | H03K 19/1776 |
| 2022/0383927 A1* | 12/2022 | Jung | G11C 11/2255 |

FOREIGN PATENT DOCUMENTS

| | | |
|---|---|---|
| JP | 7-21784 A | 1/1995 |
| KR | 10 2018 0100471 A | 9/2018 |

OTHER PUBLICATIONS

Xueqing Li, et ali. "Lowering Area Overheads for FeFET-Based Energy-Efficient Nonvolatile Flip-Flops", IEEE Transactions on Electron Devices.

* cited by examiner

*Primary Examiner* — Connie C Yoha
(74) *Attorney, Agent, or Firm* — TAROLLI, SUNDHEIM, COVELL & TUMMINO L.L.P.

(57) ABSTRACT

A nonvolatile memory device according to the embodiment includes: a first inverter; and a second inverter cross-coupled to the first inverter, wherein the second inverter includes a pull-up transistor, a pull-down transistor, and a ferroelectric field effect transistor having gate nodes connected to each other, and a restore transistor having one electrode connected to the ferroelectric field effect transistor, and the second inverter stores data in a nonvolatile manner.

44 Claims, 17 Drawing Sheets

NONVOLATILE MEMORY DEVICE AND LATCH INCLUDING THE SAME

CROSS-REFERENCE TO RELATED APPLICATION

This application claims priority to and the benefit of Korean Patent Application No. 10-2021-0018041, filed on Feb. 9, 2021, and Korean Patent Application No. 10-2021-0018040, filed on Feb. 9, 2021, the disclosure of which is incorporated herein by reference in its entirety.

BACKGROUND

Field of the Invention

The present disclosure relates to a nonvolatile memory device and a latch including the same.

Discussion of Related Art

With the improvement of the integration degree of a transistor, as a driving voltage ($V_{DD}$) and a threshold voltage (VTH) of a system-on-chip (SoC) are lowered, the influence of a leakage current is increasing. Specifically, Internet-of-things (IoT) apparatuses have a standby time that is greater than an operating time. Accordingly, reducing the leakage current in a turned-off state is important.

SUMMARY OF THE INVENTION

A nonvolatile memory device according to the embodiment includes: a first inverter; a second inverter cross-coupled to the first inverter; and a nonvolatile memory circuit, wherein the nonvolatile memory circuit includes a pull-up transistor, a pull-down transistor, and a ferroelectric field effect transistor (FeFET) of which a first electrode and a second electrode are respectively connected to the pull-up transistor and the pull-down transistor.

A latch configured to store data in a nonvolatile manner according to the embodiment includes: a first inverter; a second inverter cross-coupled to the first inverter; a nonvolatile memory circuit including a pull-up transistor, a pull-down transistor, and a ferroelectric field effect transistor of which a first electrode and a second electrode are respectively connected to the pull-up transistor and the pull-down transistor; and a third inverter configured to invert and output an output of the first inverter.

A nonvolatile memory device according to the embodiment includes: a first inverter; and a second inverter cross-coupled to the first inverter, wherein the second inverter includes a pull-up transistor, a pull-down transistor, and a ferroelectric field effect transistor having gate nodes connected to each other, and a restore transistor having one electrode connected to the ferroelectric field effect transistor, and the second inverter stores data in a nonvolatile manner.

A latch configured to store data in a nonvolatile manner according to the embodiment includes: a first inverter; a second inverter including a pull-up transistor, a pull-down transistor, and a ferroelectric field effect transistor having gate nodes connected to each other, and a restore transistor having one electrode connected to the ferroelectric field effect transistor, and cross-coupled to the first inverter; a first transmission gate connected to an input node of the first inverter; a second transmission gate having one electrode connected to an output node of the second inverter and the other electrode connected to the input node of the first inverter; and a third inverter configured to invert and output an output of the first inverter.

According to a memory device and/or a latch according to the embodiment, an advantage in that data may be stored and restored without excessive power consumption, and an advantage in that the data may be stored in a nonvolatile manner are provided.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION OF EXEMPLARY EMBODIMENTS

First Embodiment

Figure 1:
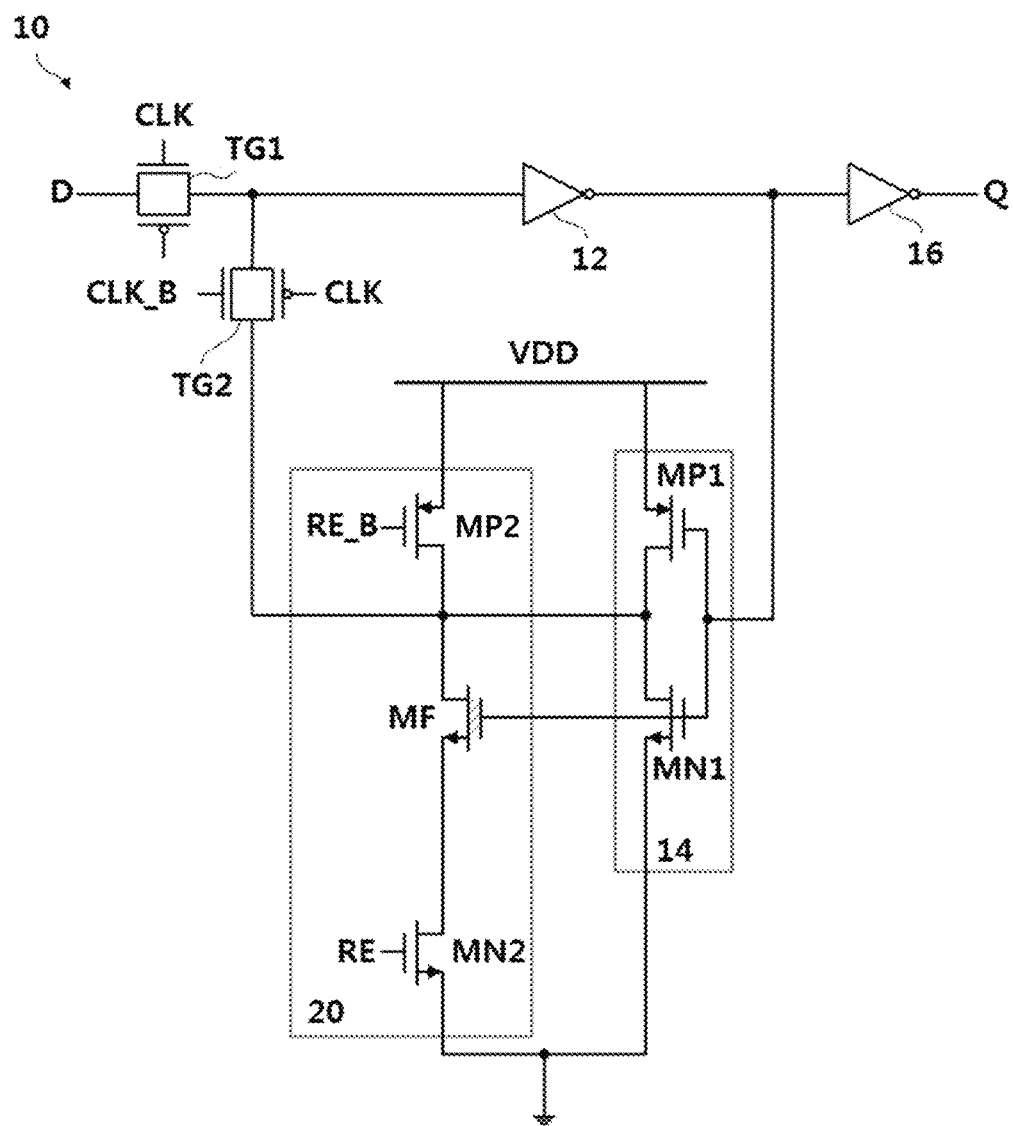
FIG. 1 is a view illustrating an outline of a latch according to the embodiment.

Hereinafter, the first embodiment will be described with reference to the accompanying drawings. FIG. 1 is a view illustrating an outline of a latch 10 according to the embodiment. Referring to FIG. 1, the latch 10 includes a first inverter 12, a second inverter 14 cross-coupled to the first inverter 12, and a nonvolatile memory circuit 20, wherein the nonvolatile memory circuit 20 includes a pull-up transistor MP2, a pull-down transistor MN2, and a ferroelectric field effect transistor (FeFET, MF) of which a first electrode and a second electrode are respectively connected to the pull-up transistor MP2 and the pull-down transistor MN2.

Figure 2:
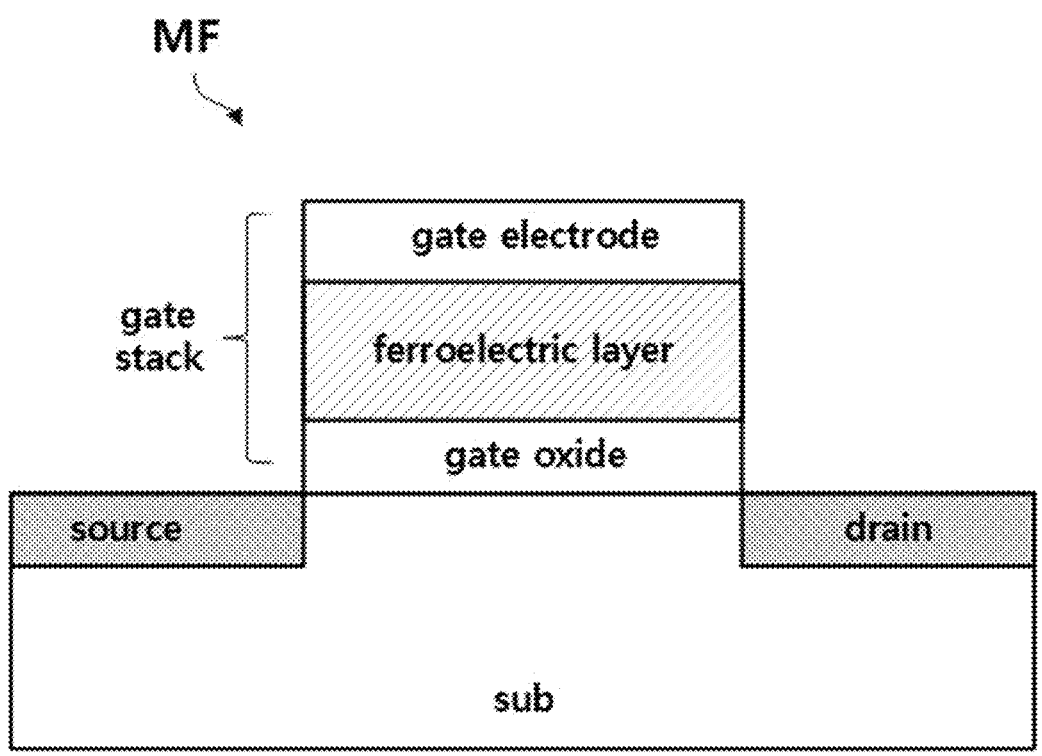
FIG. 2 is a cross-sectional view schematically illustrating a structure of a ferroelectric field effect transistor.

FIG. 2 is a cross-sectional view schematically illustrating a structure of the ferroelectric field effect transistor MF. Referring to FIG. 2, the ferroelectric field effect transistor MF may include a source, a drain, and a gate stack. The gate stack may include a gate oxide, a ferroelectric layer, and a gate electrode which are sequentially stacked. However, the ferroelectric field effect transistor MF illustrated in FIG. 2 is an example of a planar transistor, and the ferroelectric field effect transistor MF according to the embodiment may have other transistor structures in addition to a planar transistor structure.

The ferroelectric layer may be formed of a ferroelectric material. The ferroelectric material is a material in which dipoles are formed by spontaneous polarization even when an external electric field is not applied. Further, when a voltage greater than or equal to a critical voltage is applied to the ferroelectric material, the dipoles formed in the ferroelectric layer are aligned according to a direction of the electric field. In addition, when an opposite voltage greater than or equal to the critical voltage is applied to the ferroelectric material, the dipoles formed in the ferroelectric layer are aligned according to a direction of an electric field formed in the opposite direction.

Figure 3A:
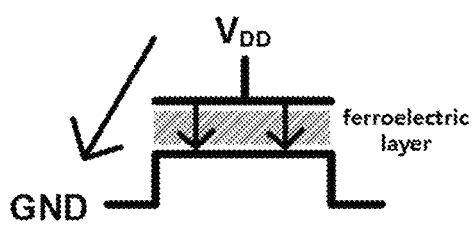
FIGS. 3A and 3B are views for describing an operation of the ferroelectric field effect transistor.
Figure 3B:
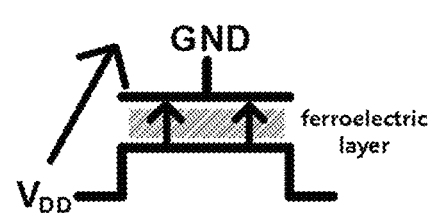
Figure 3C:
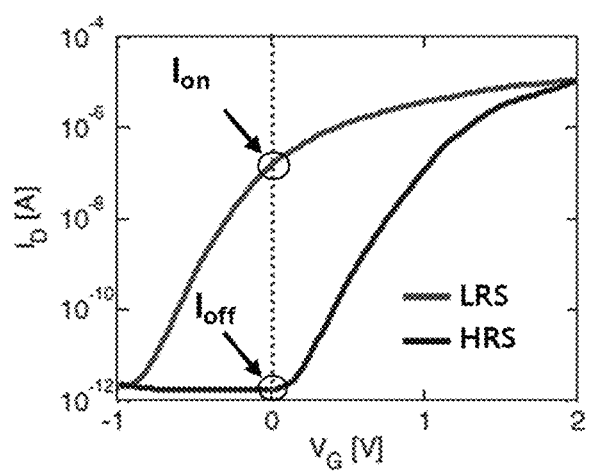
FIG. 3C is a view schematically illustrating currents flowing in the ferroelectric field effect transistor respectively in a low resistance state (LRS) and a high resistance state (HRS)

FIGS. 3A and 3B are views for describing an operation of the ferroelectric field effect transistor MF, and FIG. 3C is a view schematically illustrating currents flowing in the ferroelectric field effect transistor respectively in a low resistance state (LRS) and a high resistance state (HRS). Polarization directions of the dipoles in the ferroelectric layer in FIGS. 3A and 3B are indicated by arrows, wherein heads of the arrows are positive poles of the dipoles, and tails of the arrows are negative poles of the dipoles.

Referring to FIG. 3A, a ground voltage GND is applied to any one of a source electrode and a drain electrode of the ferroelectric field effect transistor MF, and the other one of the source electrode and the drain electrode maintains an electrically floating state. When a voltage greater than or equal to the critical voltage is applied to the gate electrode, the dipoles formed in the ferroelectric layer are aligned according to the direction of the electric field.

A case in which the positive poles of the dipoles face a substrate causes an effect similar to a decrease in threshold voltage of the transistor. Accordingly, when a sufficiently large number of positive poles of the dipoles apply the electric field toward the substrate, a channel is formed between the source and the drain even before providing the voltage through the gate electrode as illustrated in FIG. 3C. This state is referred to as the low resistance state (LRS). In the low resistance state (LRS), even when the voltage is not applied to the gate electrode, when a voltage is formed between the drain and the source, a current $I_{ON}$ may flow.

Referring to FIG. 3B, a driving voltage $V_{DD}$ greater than or equal to the critical voltage is applied to any one of the source electrode and the drain electrode of the ferroelectric field effect transistor MF, and the other one of the source electrode and the drain electrode maintains an electrically floating state. When the ground voltage GND is applied to the gate electrode, the dipoles formed in the ferroelectric layer are aligned according to the direction of the electric field.

A case in which the negative poles of the dipoles face the substrate causes an effect similar to an increase in threshold voltage of the transistor. Accordingly, when a sufficiently large number of negative poles of the dipoles apply the electric field toward the substrate, a channel may not be formed between the source and the drain even when the voltage provided through the gate electrode is greater than 0 as illustrated in FIG. 3C. This state is referred to as the high resistance state (HRS). In the high resistance state (HRS), since a large resistance is formed between the drain and the source compared to the low resistance state (LRS) even when a voltage is applied to the gate electrode, a current $I_{OFF}$ smaller than the current $I_{ON}$ flowing in the low resistance state LRS flows even when the same voltage as the low resistance state LRS is applied between the drain and the source.

The polarization directions of the dipoles formed in the ferroelectric material are maintained even when the applied voltage is removed, and from this characteristic, the latch 10 may be used as a nonvolatile memory device.

Referring again to FIG. 1, an operation of the latch 10 in a normal mode will be described. The latch 10 may operate in the normal mode operating in the same manner as a conventional latch, a backup mode in which data is stored, and a restore mode in which the stored data is restored.

In the normal mode, an inversion restore signal RE_B in a logic high state is provided to the pull-up transistor MP2 and a restore signal RE in a logic low state is provided to the pull-down transistor MN2. Accordingly, both the pull-up transistor MP2 and the pull-down transistor MN2 may be in a blocked state in the normal mode.

When a clock signal CLK is in the logic high state, an input D passes through a first transmission gate TG1 to be output as an input of the first inverter 12, and the first inverter 12 inverts and outputs the provided input. Since a third inverter 16 inverts an output of the first inverter 12 and provides the output as an output Q, the latch 10 outputs Q the same logic state as the input D when the clock signal CLK is in the logic high state.

The output of the first inverter 12 is provided as an input of the second inverter 14, and the output of the second inverter 14 is blocked by a second transmission gate TG2. However, since an inverted clock signal CLK_B in which the clock signal CLK is inverted is formed in a logic high state (that is, the clock signal CLK is logic low), the second transmission gate TG2 provides the output of the second inverter 14 as the input of the first inverter 12. Accordingly, the latch 10 latches up and outputs the input signal D while the clock signal CLK is in the logic low state (that is, the inverted clock signal CLK_B is logic high).

Figure 4:
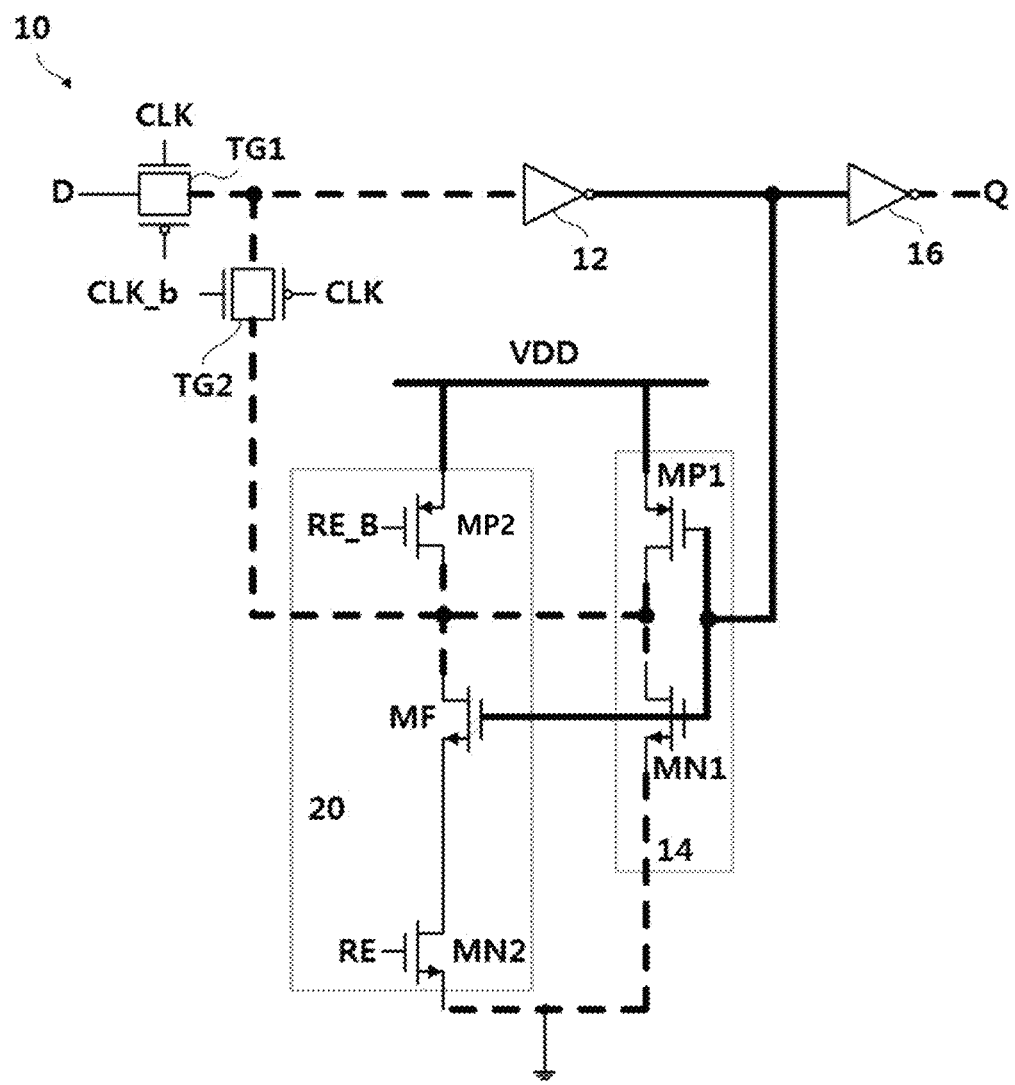
FIG. 4 is a view illustrating an operation of the latch in a backup mode when an output of the latch is logic low.
Figure 5:
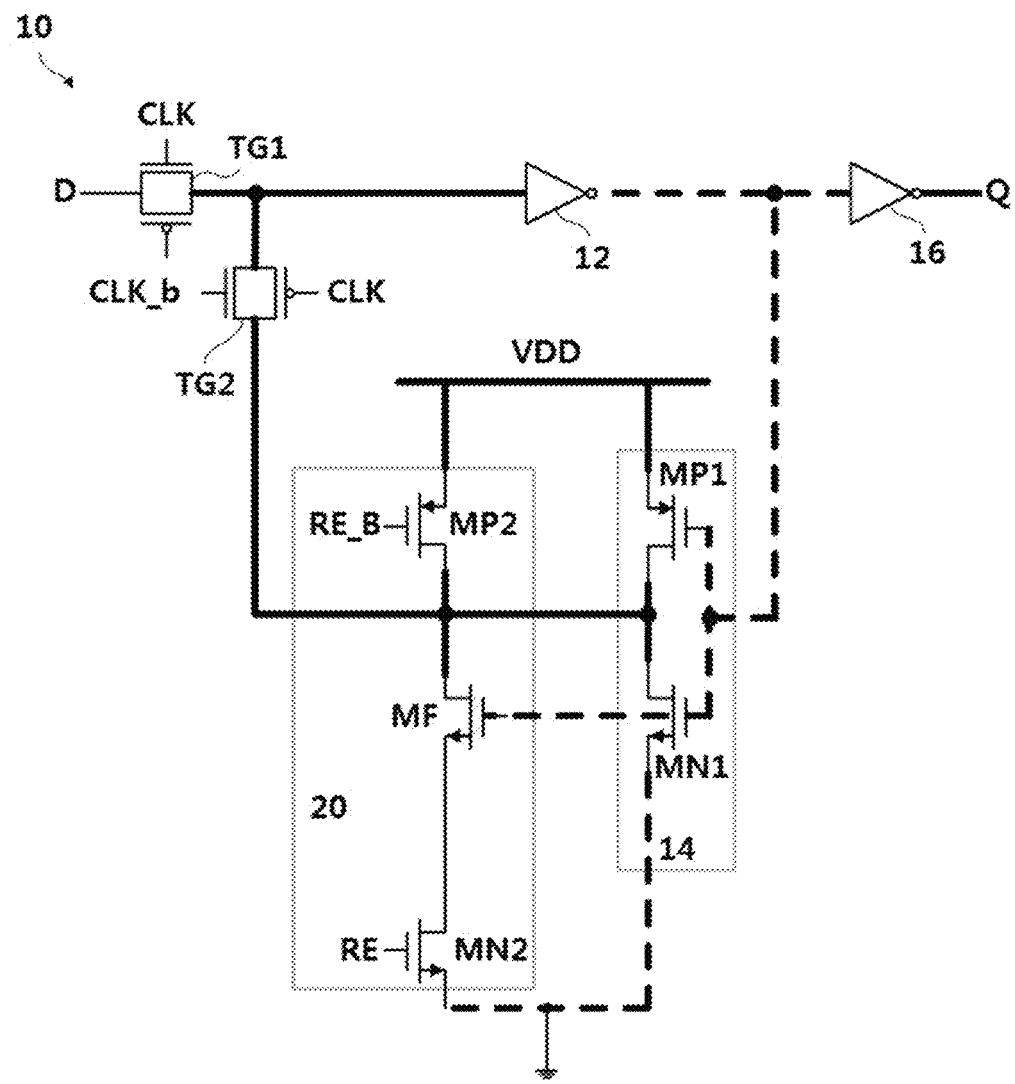
FIG. 5 is a view illustrating an operation of the latch in the backup mode when the output of the latch is logic high.

Subsequently, the operation of the latch 10 which operates in the backup mode will be described with reference to FIGS. 4 and 5. The backup mode may be performed when the clock signal CLK is logic low (that is, in a state in which the inverted clock signal CLK_B is logic high). In FIGS. 4 and 5, a node formed with a voltage corresponding to the driving voltage $V_{DD}$ is shown as a thick solid line, and a node formed with a voltage corresponding to the ground voltage GND is shown as a thick dashed line. FIG. 4 is a view illustrating the operation of the latch 10 in the backup mode when the output Q of the latch 10 is logic low. Referring to FIG. 4, when the output Q of the latch is logic low, the output of the first inverter 12 is in a logic high state. An NMOS transistor MN1 included in the second inverter 14 receives the output of the first inverter 12 and is turned on. Accordingly, the second inverter 14 outputs the voltage corresponding to the ground voltage GND.

The voltage output from the second inverter 14 is provided to the drain electrode of the ferroelectric field effect transistor MF, and the voltage corresponding to the driving voltage $V_{DD}$ output from the first inverter 12 is provided to the gate electrode of the ferroelectric field effect transistor MF. Since the pull-down transistor MN2 and the pull-up transistor MP2 are controlled to be blocked by the restore signal RE and the inversion restore signal RE_B signal, the source electrode of the ferroelectric field effect transistor MF maintains a floating state. Accordingly, the ferroelectric field effect transistor MF is programmed to the low resistance state (LRS) as illustrated in FIG. 3A to store the corresponding data. The voltage corresponding to the ground voltage GND output from the second inverter 14 is provided as the input of the first inverter 12 through the second transmission gate TG2.

FIG. 5 is a view illustrating an operation of the latch 10 in the backup mode when the output Q of the latch 10 is logic high. Referring to FIG. 5, when the output Q of the latch 10 is logic high, the output of the first inverter 12 is logic low. A PMOS transistor MP1 included in the second inverter 14 receives the output of the first inverter 12 and is turned on. Accordingly, the second inverter 14 outputs the voltage corresponding to the driving voltage $V_{DD}$.

The voltage output from the second inverter 14 is provided to the drain electrode of the ferroelectric field effect transistor MF, and the voltage corresponding to the ground voltage GND output from the first inverter 12 is provided to the gate electrode of the ferroelectric field effect transistor MF. Since the pull-down transistor MN2 and the pull-up transistor MP2 are controlled to be blocked by the restore signal RE and the inversion restore signal RE_B signal, the source electrode of the ferroelectric field effect transistor MF maintains a floating state. Accordingly, the ferroelectric field effect transistor MF is programmed to the high resistance state (HRS) as illustrated in FIG. 3B to store the corresponding data. The voltage corresponding to the driving voltage $V_{DD}$ output from the second inverter 14 is provided as the input of the first inverter 12 through the second transmission gate TG2.

As described above, when the driving voltage $V_{DD}$ is greater than the threshold voltage forming the polarization directions of a ferroelectric included in the ferroelectric field effect transistor MF, the data may be backed up during a data latch-up process of the latch 10.

Hereinafter, the operation of the latch 10 in a data restore mode according to the embodiment will be described with reference to FIGS. 6 to 8. The restore mode may be performed when power provided to the latch 10 and/or an apparatus (not shown) including the latch 10 is blocked and then power is supplied again. When power supply is resumed after the power is blocked, the driving voltage $V_{DD}$ does not immediately increase, but gradually and linearly increases due to the influence of a capacitance in the circuit and an output of a driving voltage generator (not shown). Accordingly, the first and second inverters in the latch 10 may not immediately operate.

However, a restore signal forming unit (not shown) providing the restore signal RE and the inversion restore signal RE_B in the restore mode provides the restore signal RE and the inversion restore signal RE_B each having a magnitude capable of turning on the pull-up transistor MP2 and the pull-down transistor MN2 while the driving voltage $V_{DD}$ gradually and linearly increases. Accordingly, when the restore mode starts, the first inverter 12 and the second inverter 14 do not operate, and only the pull-up transistor MP2 and the pull-down transistor MN2 transistor are turned on.

Further, the restore mode may be performed when the clock signal CLK is logic low (that is, in a state in which the inverted clock signal CLK_B is logic high). FIG. 6 is a view illustrating a restore mode example in a state in which the ferroelectric field effect transistor MF is programmed to the low resistance state (LRS). Referring to FIG. 6, in the restore mode, the pull-up transistor MP2 and the pull-down transistor MN2 are provided with the inversion restore signal RE_B and the restore signal RE and controlled to be turned on.

When the ferroelectric field effect transistor MF is programmed to the low resistance state (LRS), since a low resistance path is formed from a driving voltage $V_{DD}$ rail to a ground voltage GND rail, a voltage at an output node O of the memory circuit 20 may be unclear. However, when a size of the pull-down transistor MN2, that is, a width of a channel in which the current flows through the pull-down transistor MN2 is formed to be large to reduce resistance while the pull-down transistor MN2 is turned on, a voltage at the output node O of the memory circuit 20 may be formed as a voltage close to the ground voltage.

Figure 6:
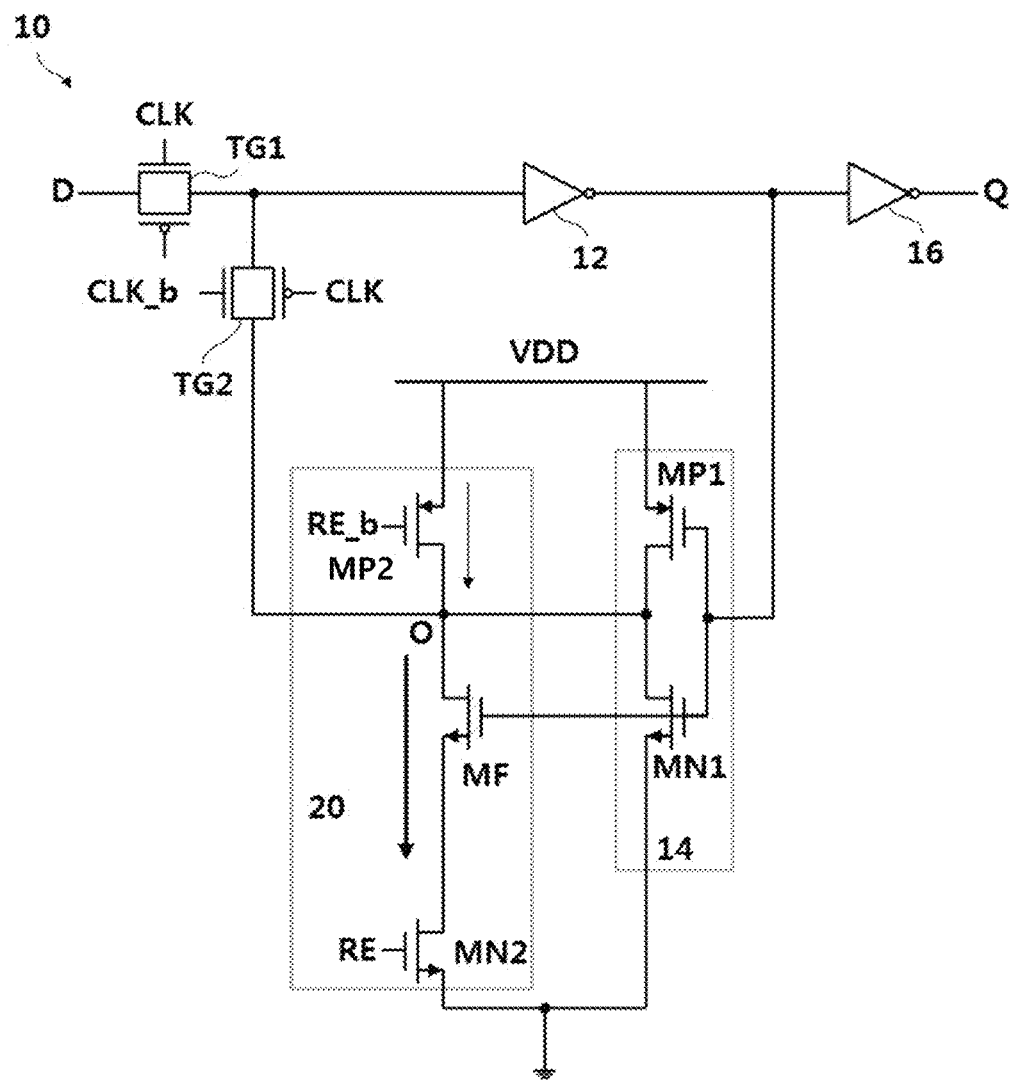
FIG. 6 is a view illustrating a restore mode example in a state in which the ferroelectric field effect transistor is programmed to the low resistance state (LRS)

As shown in FIG. 6, the voltage at the output node O of the memory circuit 20 may be formed as the voltage corresponding to the ground voltage by making an equivalent resistance of a current path passing through the pull-down transistor MN2 smaller than an equivalent resistance of a current path passing through the pull-up transistor MP2. Accordingly, the voltage of the output node O formed like the above may restore the output of the logic low by passing through the second transmission gate TG2, the first inverter 12, and the third inverter 16.

Figure 7:
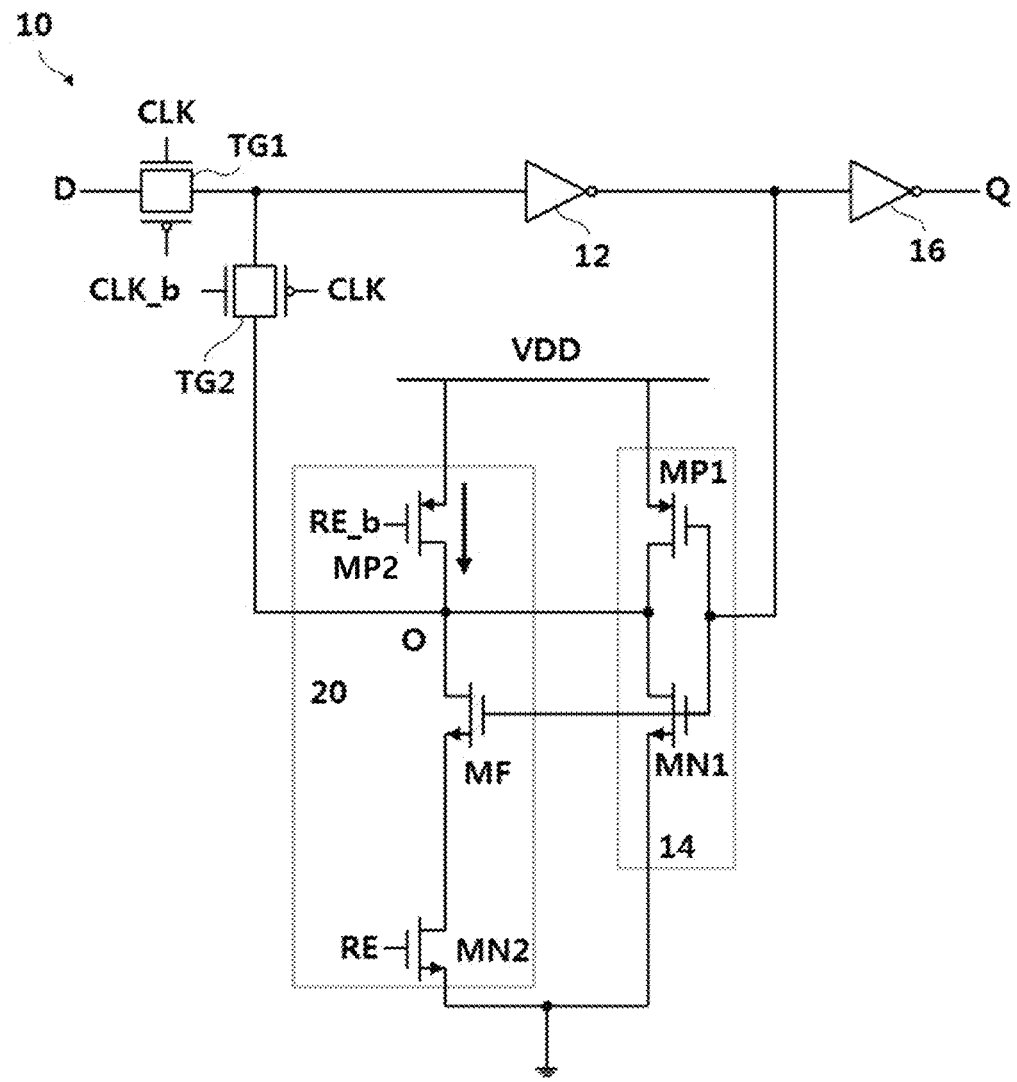
FIG. 7 is a view illustrating a restore mode example in a state in which the ferroelectric field effect transistor is programmed to the high resistance state (HRS)

FIG. 7 is a view illustrating a restore mode example in a state in which the ferroelectric field effect transistor MF is programmed to the high resistance state (HRS). Referring to FIG. 7, in the restore mode, the pull-up transistor MP2 and the pull-down transistor MN2 are provided with the inversion restore signal RE_B and the restore signal RE and controlled to be turned on.

However, since the ferroelectric field effect transistor MF is programmed to the high resistance state (HRS), a path from the output node O to the ground voltage GND rail is blocked and the output node O is formed with a voltage corresponding to the linearly increasing driving voltage $V_{DD}$. Accordingly, the data programmed in the ferroelectric field effect transistor MF may be restored through the second transmission gate TG2, first inverter 12, and third inverter 16.

Figure 8:
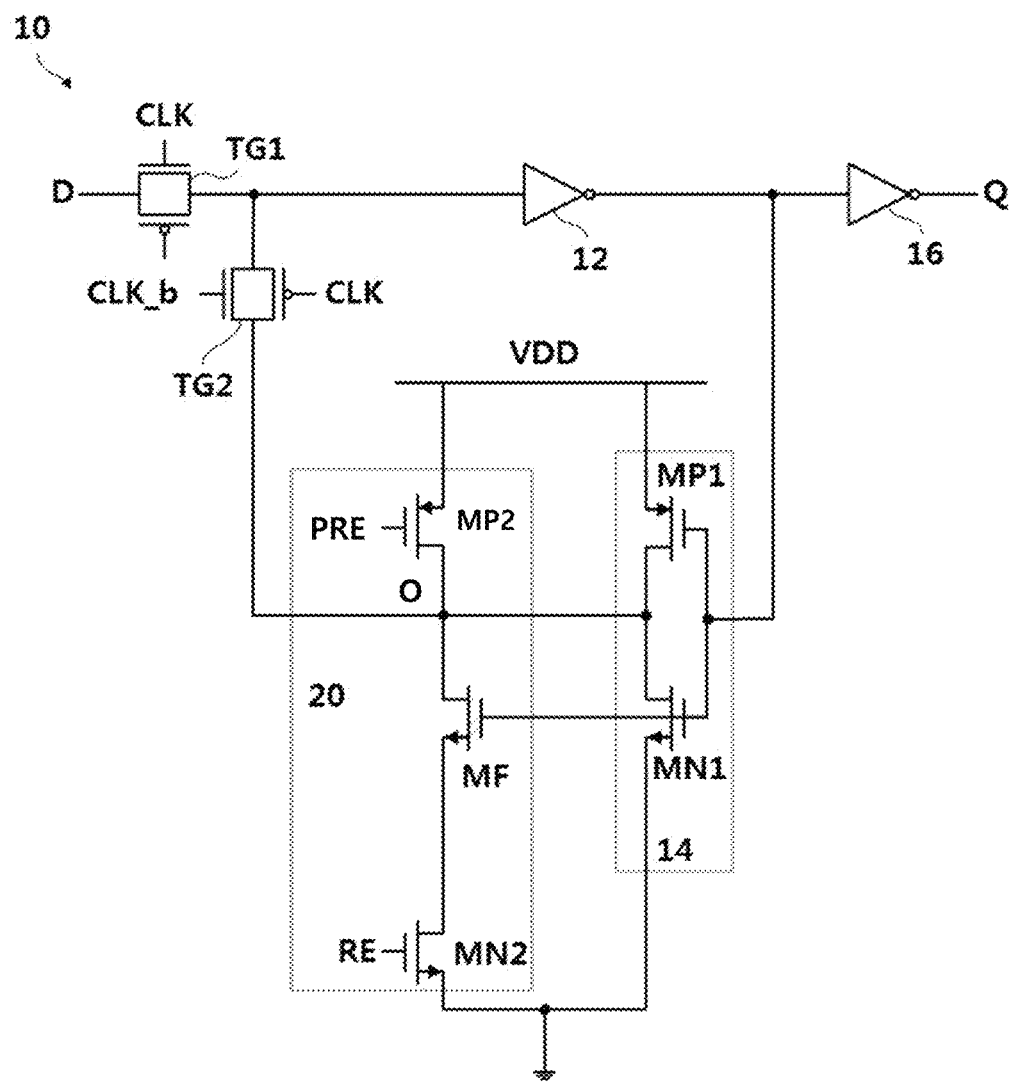
FIG. 8 is a view schematically illustrating a second example when the latch according to the embodiment operates in the restore mode.

FIG. 8 is a view schematically illustrating a second embodiment when the latch 10 according to the embodiment operates in the restore mode. Referring to FIG. 8, in the restore mode, the pull-down transistor MN2 is blocked, but the pull-up transistor MP2 is turned on by a pre-charge signal PRE, and pre-charges the output node O to the voltage corresponding to the driving voltage $V_{DD}$.

Subsequently, the restore signal RE is provided to the gate of the pull-down transistor MN2 so that the pull-down transistor MN2 is turned on. When the ferroelectric field effect transistor MF is programmed to the low resistance state (LRS), since a low resistance current path is formed from the output node O to the ground voltage GND rail, charges pre-charged at the output node O are discharged. Accordingly, an output in the logic low state is restored in the first inverter 12

However, when the ferroelectric field effect transistor MF is programmed to the high resistance state (HRS), since high resistance is formed from the output node O to the ground voltage GND rail, the charges pre-charged at the output node O are not discharged, and a voltage corresponding to the high resistance state programmed in the ferroelectric field effect transistor is restored.

Figure 9:
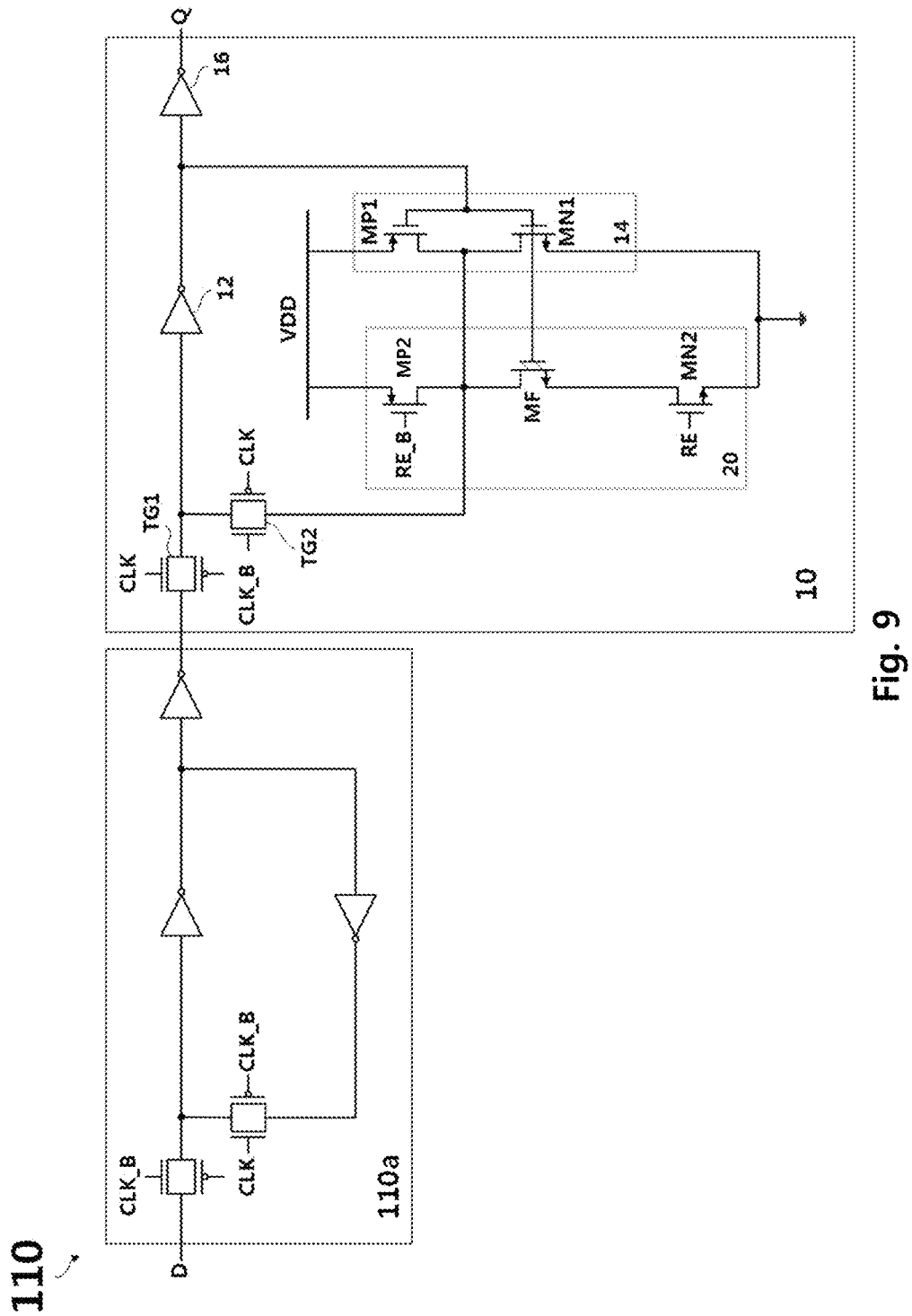
FIGS. 9 and 10 are schematic views of a flip-flop including the latch according to the embodiment.
Figure 10:
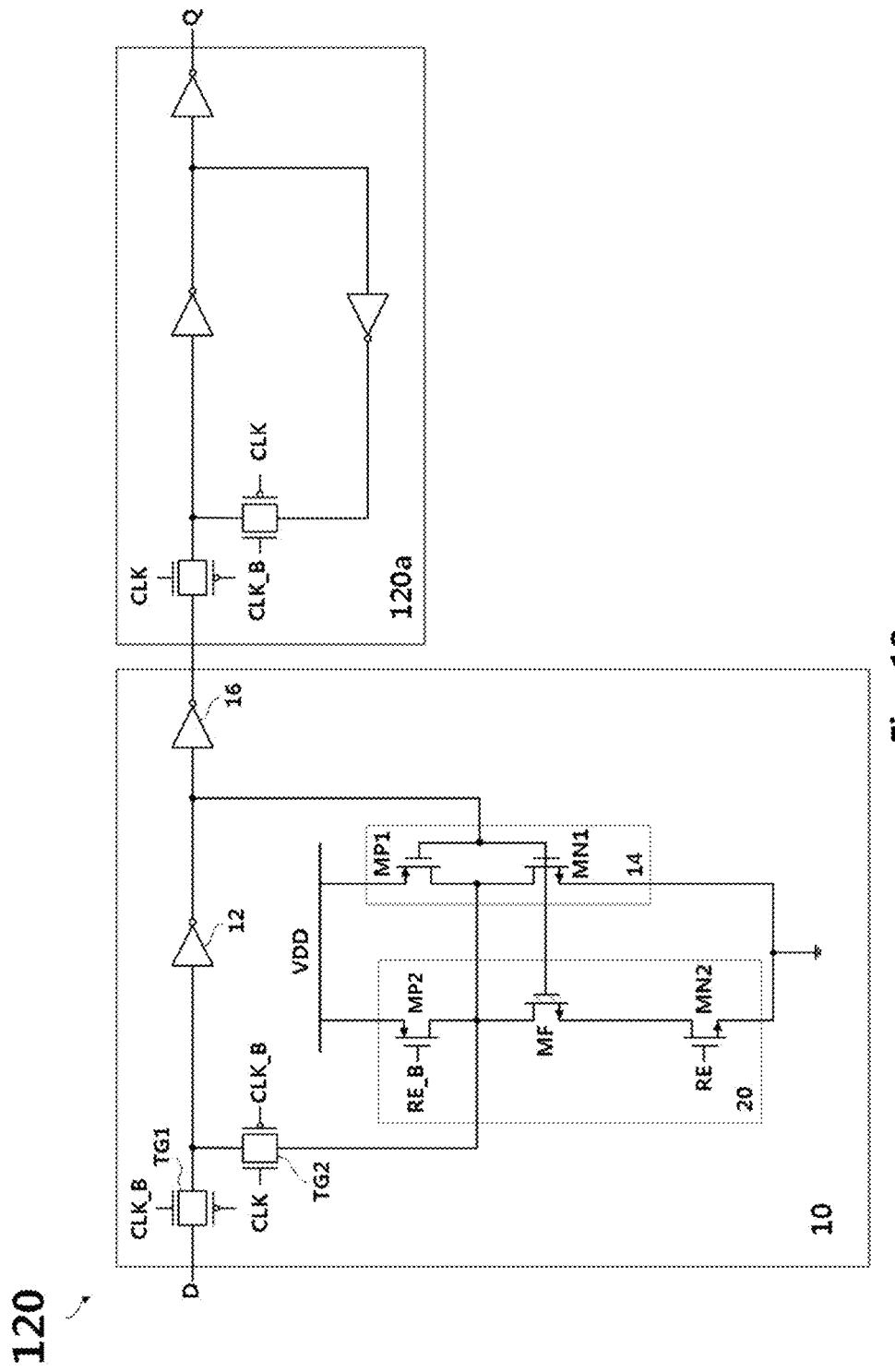

FIGS. 9 and 10 are schematic views of a flip-flop 110 including a latch 10 according to the embodiment. Referring to FIG. 9, a flip-flop 110 may be implemented as a master latch 110a and a slave latch 10 connected in a cascade. As shown in the drawing, the slave latch 10 may be the latch according to the embodiment. The flip-flop 100 illustrated in FIG. 9 samples and outputs an input D at a rising edge of a clock. Further, as described above, a backup mode and a restore mode may be performed in the slave latch 10 in a state in which a clock signal CLK is logic low.

FIG. 10 is a view illustrating a flip-flop 120 according to another embodiment. Referring to FIG. 10, the flip-flop 120 uses the latch 10 according to the embodiment as a master latch, and includes a slave latch 120a connected to the latch 10 according to the embodiment in a cascade. The flip-flop 120 according to the embodiment samples and outputs an input D at a rising edge of the clock like the above-described flip-flop. However, as described above, in the master latch 10, the backup mode and the restore mode may be performed in a state in which the clock signal CLK is logic high.

Second Embodiment

Figure 11:
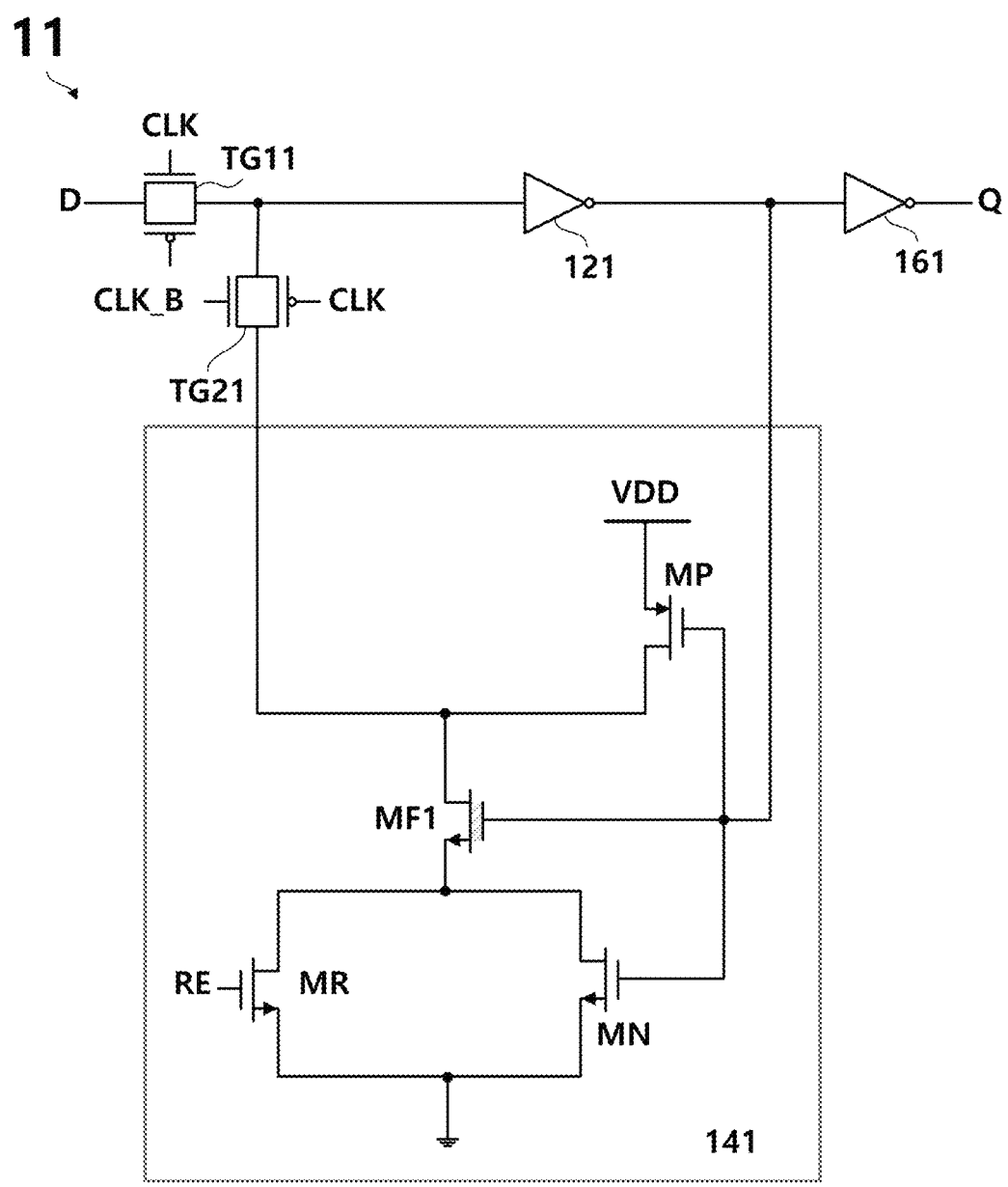
FIG. 11 is a view illustrating an outline of a latch according to the embodiment.

Hereinafter, the second embodiment will be described with reference to FIGS. 11 to 17. For concise and clear description, descriptions of elements the same as or similar to the above-described embodiment may be omitted. FIG. 11 is a view illustrating an outline of a latch 11 according to the embodiment. Referring to FIG. 11, the latch 11 includes a first inverter 121, and a second inverter 141 cross-coupled to the first inverter 121, wherein the second inverter 141 includes a pull-up transistor MP, a pull-down transistor MN, and a ferroelectric field effect transistor MF1 having gates connected to each other, and a restore transistor MR having one electrode connected to the ferroelectric field effect transistor MF1, and the second inverter 141 stores data in a nonvolatile manner.

An operation of the latch 11 in a normal mode will be described with reference to FIG. 11. The latch 11 may operate in the normal mode which operates in the same manner as the conventional latch and stores data, and a restore mode in which the stored data is restored. In the normal mode, a restore signal is provided so that the restore transistor is blocked. For example, a restore signal RE in a logic low state is provided to block the restore transistor.

When a clock signal CLK is in a logic high state, an input D passes through a first transmission gate TG11 and is output as an input of the first inverter 121, and the first inverter 121 inverts and outputs the provided input. Since a third inverter 161 inverts an output of the first inverter 121 and provides the output as an output Q, the latch 11 outputs the output Q in the same logic state as the input D when the clock signal CLK is in the logic high state.

The output of the first inverter 121 is provided to the mutually connected gates of the pull-up transistor MP, the pull-down transistor MN, and the ferroelectric field effect transistor MF1 of the second inverter 141.

As an inverted clock signal CLK_B in which the clock signal CLK is inverted is formed in a logic high state (that is, the clock signal CLK is logic low), a second transmission gate TG21 provides the output of the second inverter 141 as the input of the first inverter 121. Accordingly, the latch 11 latches up and outputs the input signal D while the clock signal CLK is in the logic low state (that is, the inverted clock signal CLK_B is logic high).

Figure 12:
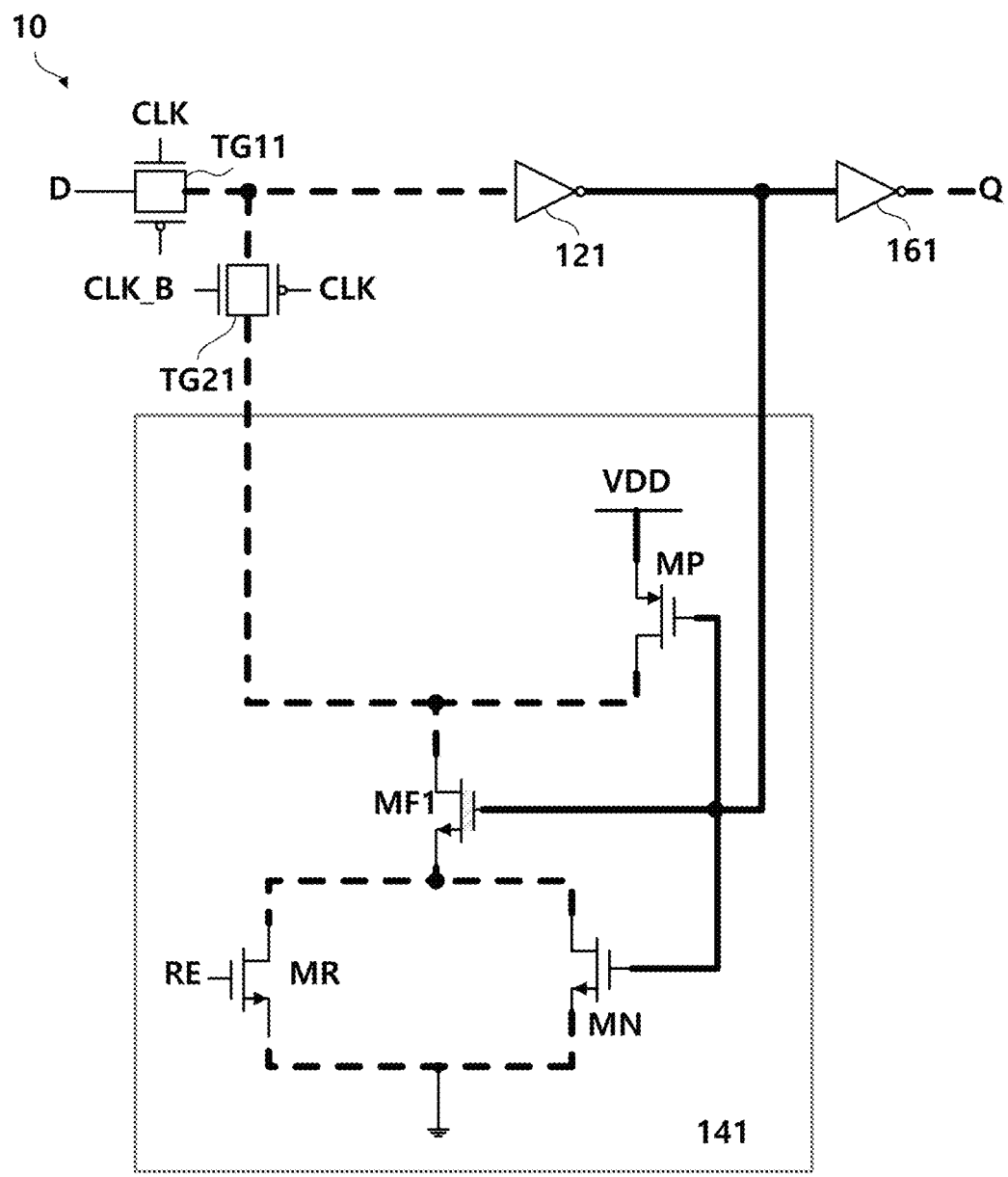
FIG. 12 is a view illustrating an operation of the latch in a backup mode when the output of the latch is logic low.
Figure 13:
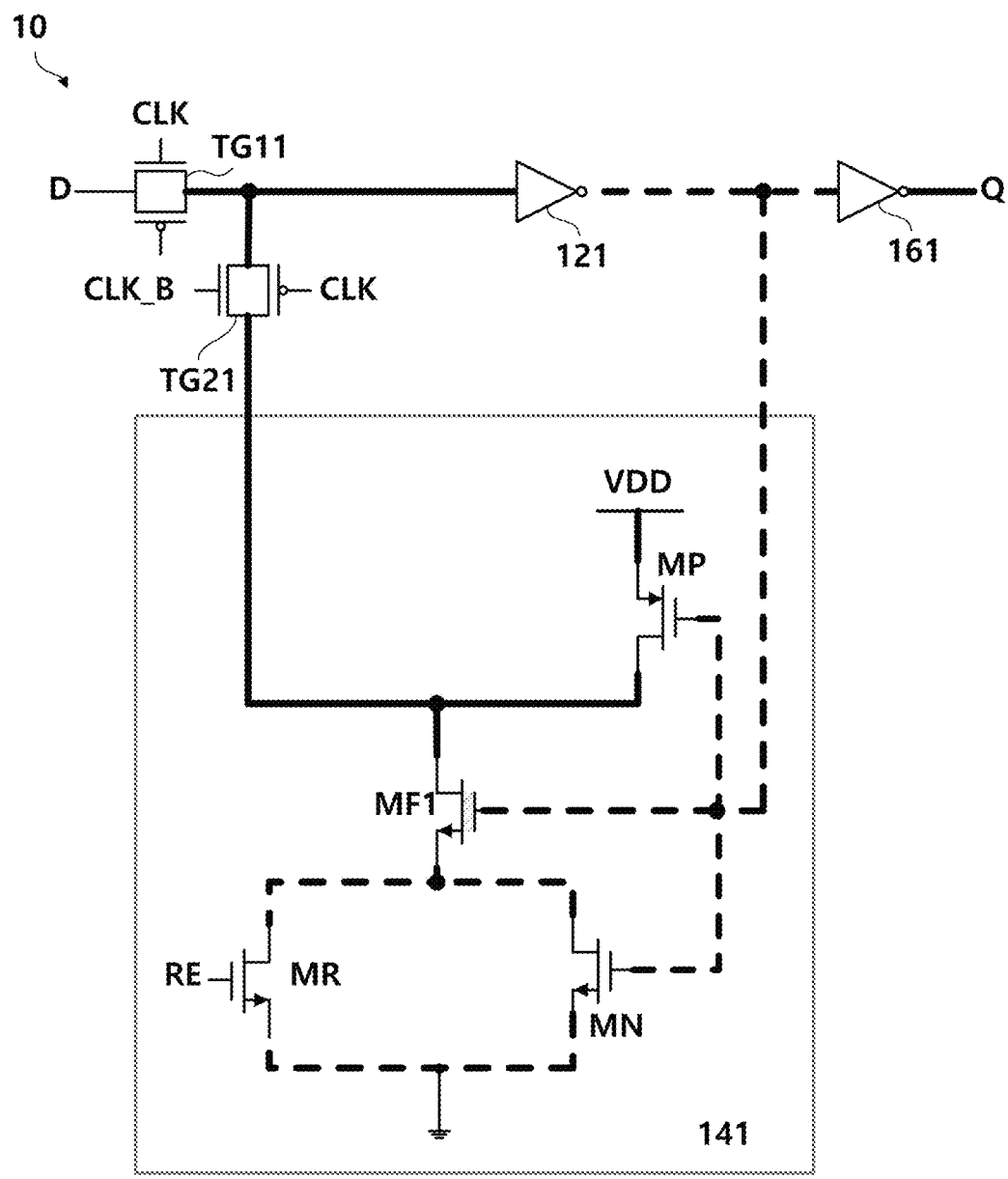
FIG. 13 is a view illustrating an operation of the latch when the output of the latch is logic high.

Since a structure of the ferroelectric field effect transistor MF1 and a schematic operation thereof are similar to those described with reference to FIGS. 2 and 3, descriptions thereof will be omitted. Subsequently, a process in which the latch 11 stores data will be described with reference to FIGS. 12 and 13. The process of storing data may be performed when the clock signal CLK is logic low (that is, in a state in which the inverted clock signal CLK_B is logic high). In FIGS. 12 and 13, a node formed with a voltage corresponding to the driving voltage $V_{DD}$ is shown as a thick solid line, and a node formed with a voltage corresponding to the ground voltage GND is shown as a thick dashed line. FIG. 12 is a view illustrating an operation of the latch 11 in the backup mode when the output Q of the latch 11 is logic low. Referring to FIG. 12, when the output Q of the latch is logic low, the output of the first inverter 121 is in the logic high state. The pull-down transistor MN included in the second inverter 141 receives the output of the first inverter 121 and is turned on. Accordingly, a voltage corresponding to the ground voltage provided through a drain electrode of the pull-down transistor MN is provided to a source electrode of the ferroelectric field effect transistor MF1.

The voltage corresponding to the driving voltage $V_{DD}$ output from the first inverter 121 is provided to a gate electrode of the ferroelectric field effect transistor MF1. The restore transistor MR is controlled to be blocked by the restore signal RE. Accordingly, the ferroelectric field effect transistor MF1 is programmed to the low resistance state (LRS) as illustrated in FIG. 3A to store the corresponding data. Further, the second inverter 141 outputs the voltage corresponding to a logic low voltage through a pull-down path formed of the pull-down transistor MN and the ferroelectric field effect transistor MF1.

The voltage corresponding to the ground voltage GND output from the second inverter 141 is provided as the input of the first inverter 121 through the second transmission gate TG21.

FIG. 13 is a view illustrating an operation of the latch 11 when the output Q of the latch 11 is logic high. Referring to FIG. 13, when the output Q of the latch 10 is logic high, the output of the first inverter 121 is logic low. The pull-down transistor MN included in the second inverter 141 is blocked, but the pull-up transistor MP is turned on. Accordingly, the second inverter 141 outputs the voltage corresponding to the driving voltage $V_{DD}$, and the voltage output from the second inverter 141 is provided to a drain electrode of the ferroelectric field effect transistor MF1.

The voltage corresponding to the ground voltage GND output from the first inverter 121 is provided to the gate electrode of the ferroelectric field effect transistor MF1. Since the restore transistor MR is controlled to be blocked by the restore signal RE, the source electrode of the ferroelectric field effect transistor MF1 maintains a floating state. Accordingly, the ferroelectric field effect transistor MF1 is programmed to the high resistance state (HRS) as illustrated in FIG. 3B to store the corresponding data. The voltage corresponding to the driving voltage $V_{DD}$ output from the second inverter 141 is provided as the input of the first inverter 121 through the second transmission gate TG21.

As described above, when the driving voltage $V_{DD}$ is greater than a threshold voltage forming the polarization directions of a ferroelectric included in the ferroelectric field effect transistor MF1, the data may be backed up during a data latch-up process of the latch 11.

Hereinafter, the operation of the latch 11 in a data restore mode according to the embodiment will be described with reference to FIGS. 14 and 15. The restore mode may be performed when power provided to the latch 11 and/or an apparatus (not shown) including the latch 11 is blocked and then power is supplied again. When power supply is resumed after the power is blocked, the driving voltage $V_{DD}$ does not immediately increase, but gradually increases due to the influence of a capacitance in the circuit and an output of a driving voltage generator (not shown). Accordingly, a first inverter in the latch 11 outputs a voltage close to the ground voltage as a low driving voltage is provided, unlike a case in which a normal driving voltage is provided. However, a restore signal forming unit (not shown) providing the restore signal RE in the restore mode provides the restore signal RE having a magnitude capable of turning on the restore transistor MR while the driving voltage $V_{DD}$ gradually and linearly increases.

Further, the restore mode may be performed when the clock signal CLK is logic low (that is, in a state in which the inverted clock signal CLK_B is the logic high). FIG. 14 is a view illustrating a restore mode example in a state in which the ferroelectric field effect transistor MF1 is programmed to the low resistance state (LRS). Referring to FIG. 14, in the restore mode, the pull-up transistor MP is weakly turned on as a voltage close to the ground voltage is provided. However, the restore transistor MR is provided with the restore signal RE and turned on.

When the ferroelectric field effect transistor MF1 is programmed to the low resistance state (LRS), a low resistance path is formed from a driving voltage $V_{DD}$ rail to a ground voltage GND rail. However, since the pull-up transistor MP is weakly turned on, and a turning-on resistance of a pull-up path formed from the pull-up transistor MP to the driving voltage $V_{DD}$ rail is formed greater than a turning-on resistance of a pull-down path including the ferroelectric field effect transistor MF1 and the restore transistor MR.

Further, when a size of the restore transistor MR, that is, a width of a channel in which a current flows through the restore transistor MR is formed to be large to reduce resistance while the restore transistor MR is turned on, since the turning-on resistance of the pull-down path may be formed to be low, a voltage at an output node O of the second inverter may be formed as a voltage close to the ground voltage.

Figure 14:
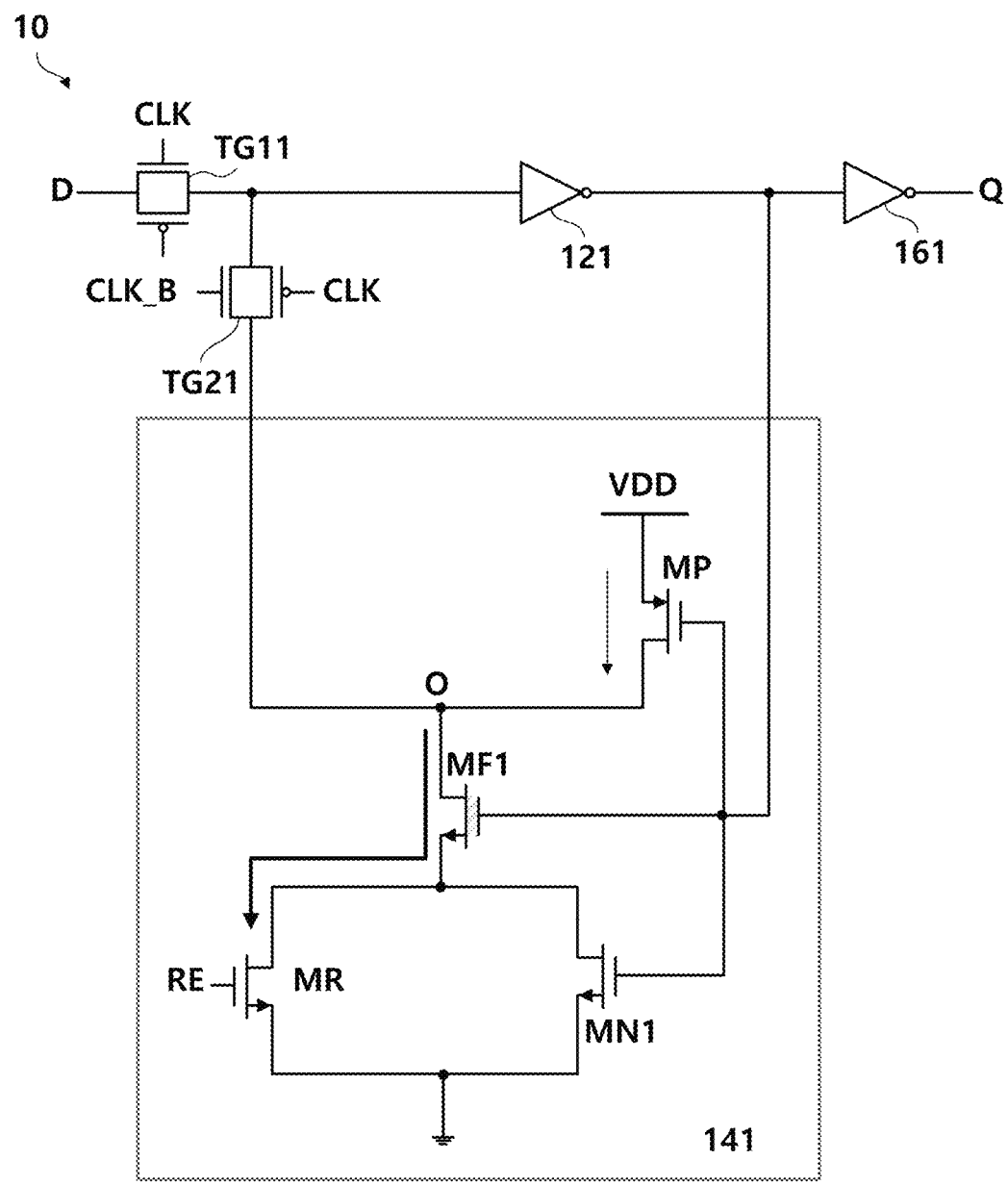
FIG. 14 is a view illustrating a restore mode example in a state in which the ferroelectric field effect transistor is programmed to the low resistance state (LRS)

As shown in FIG. 14, the voltage at the output node O of the memory circuit 20 may be formed as the voltage corresponding to the ground voltage by making an equivalent resistance of the pull-down path passing through the restore transistor MR smaller than an equivalent resistance of the pull-up path passing through the pull-up transistor MP. Accordingly, the voltage of the output node O formed like the above may restore the output of the logic low by passing through the second transmission gate TG21, the first inverter 121, and the third inverter 161.

Figure 15:
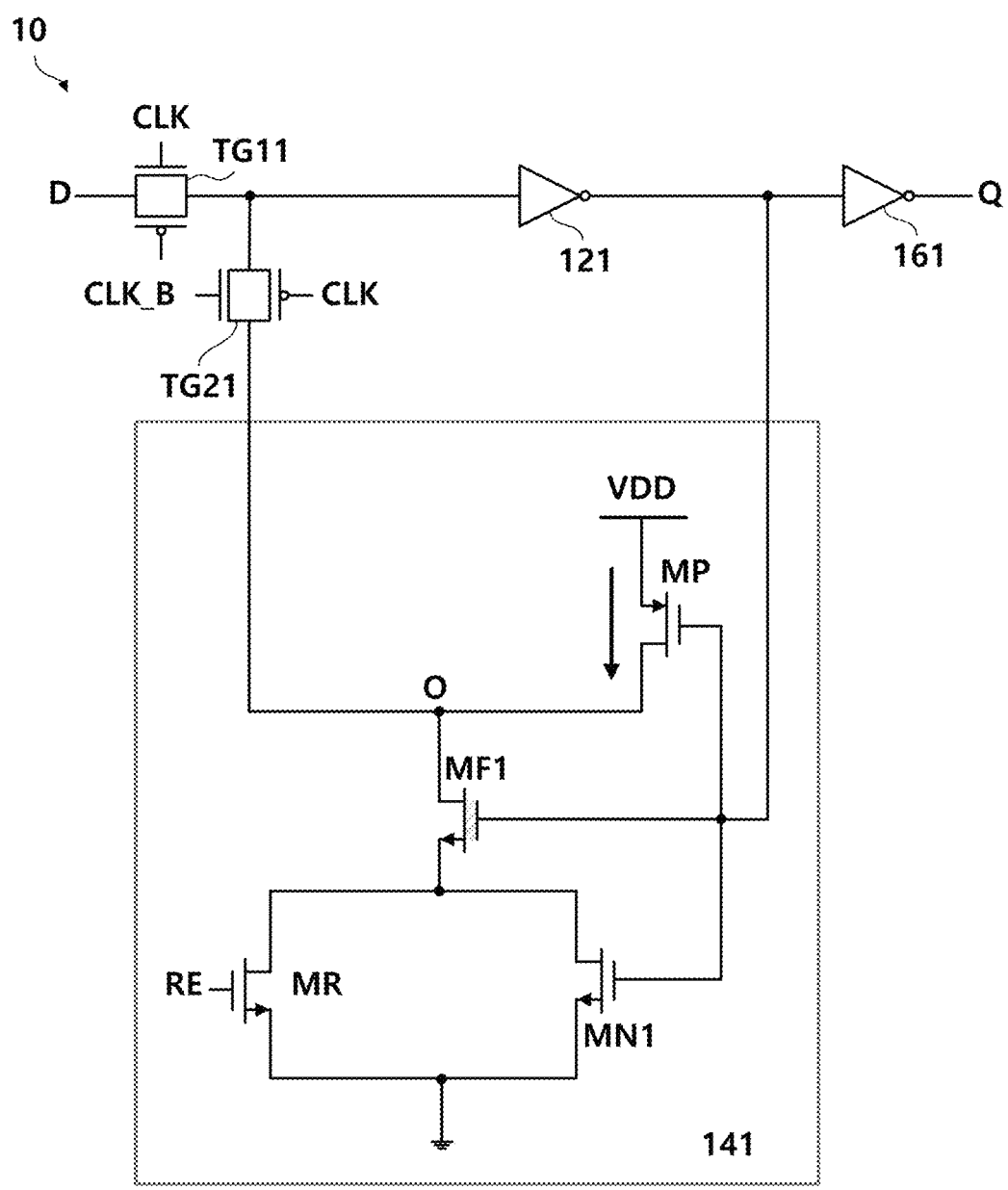
FIG. 15 is a view illustrating a restore mode example in a state in which the ferroelectric field effect transistor is programmed to the high resistance state (HRS)

FIG. 15 is a view illustrating a restore mode example in a state in which the ferroelectric field effect transistor MF1 is programmed to the high resistance state (HRS). Referring to FIG. 15, in the restore mode, the restore transistor MR is provided with the restore signal RE and controlled to be turned on. Further, the pull-up transistor MP is weakly turned on in the restore mode.

However, since the ferroelectric field effect transistor MF1 is programmed to the high resistance state (HRS), a path from the output node O to the ground voltage GND rail is blocked and the output node O is formed with a voltage corresponding to the linearly increasing driving voltage $V_{DD}$ due to the turned on pull-up transistor MP. Accordingly, the data programmed in the ferroelectric field effect transistor MF1 may be restored through the second transmission gate TG21, the first inverter 121, and the third inverter 161.

Figure 16:
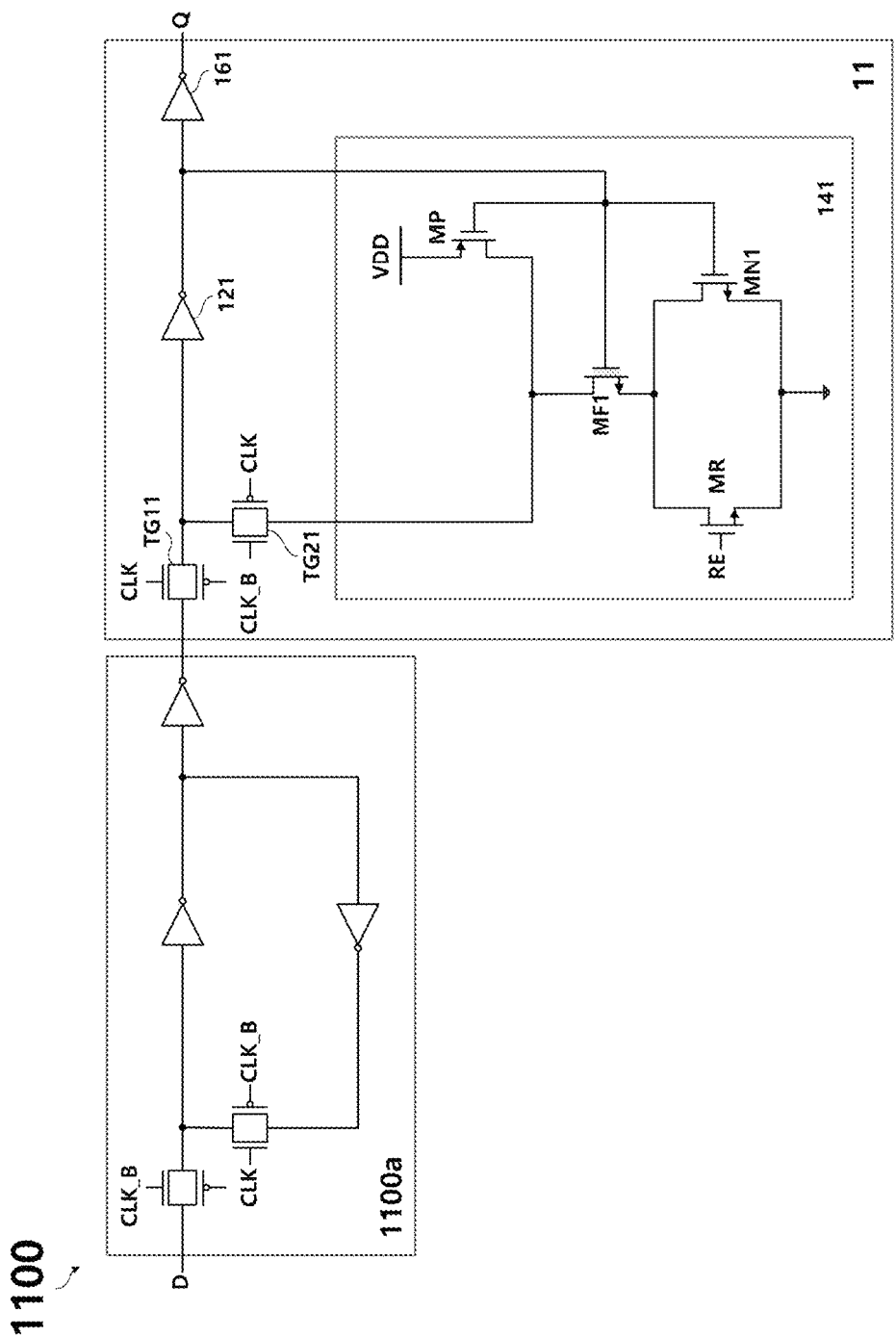
FIGS. 16 and 17 are schematic views of a flip-flop including the latch according to the embodiment.
Figure 17:
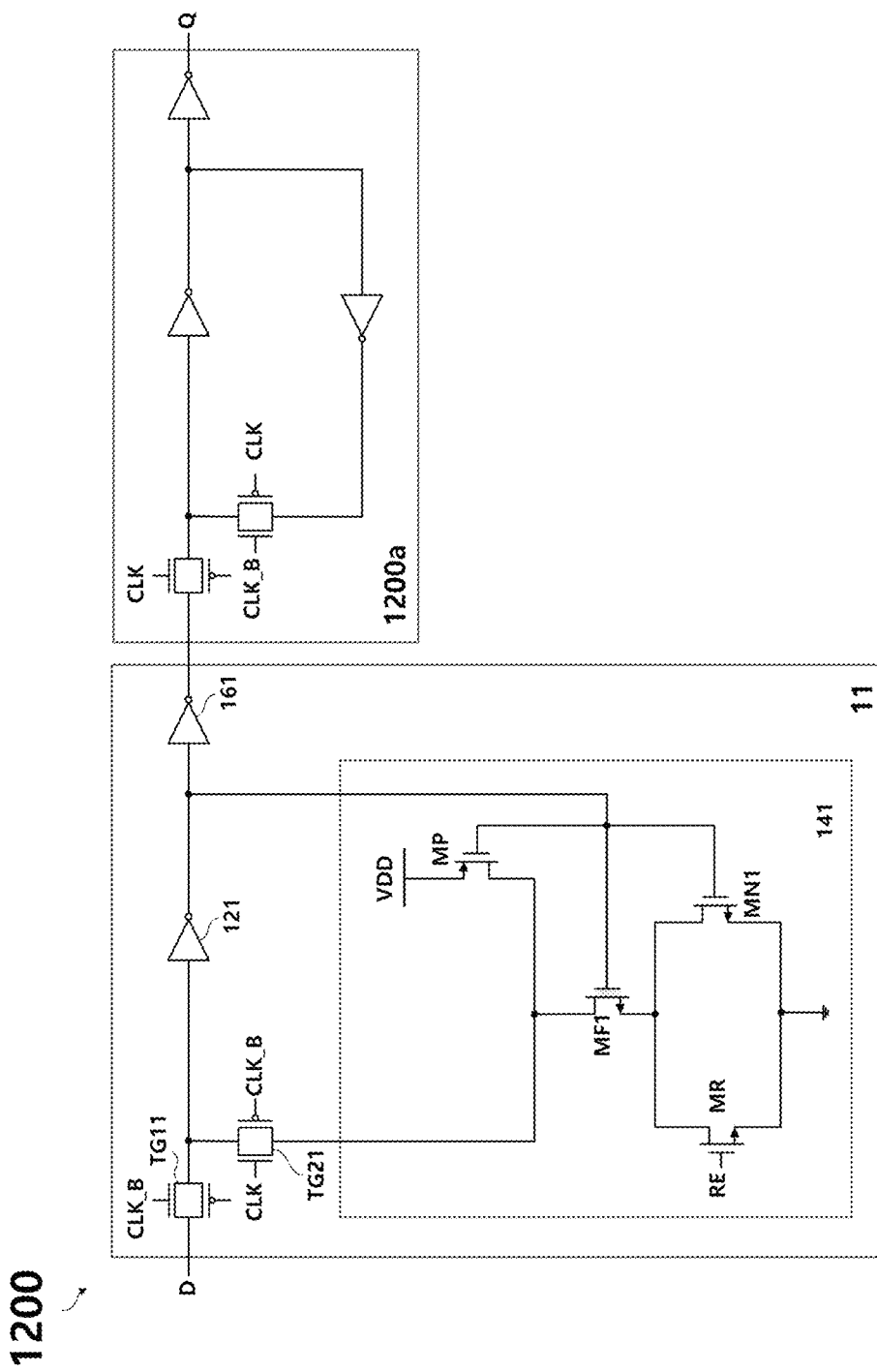

FIGS. 16 and 17 are schematic views of a flip-flop 1100 including a latch 11 according to the embodiment. Referring to FIG. 16, the flip-flop 1100 may be implemented as a master latch 1100a and a slave latch 11 connected in a cascade. As shown in the drawing, the slave latch 11 may be the latch according to the embodiment. The flip-flop 1100 illustrated in FIG. 16 samples and outputs an input D at a rising edge of a clock. Further, as described above, a data storing mode and a restore mode may be performed in the slave latch 11 in a state in which a clock signal CLK is logic low.

FIG. 17 is a view illustrating a flip-flop 1200 according to another embodiment. Referring to FIG. 17, the flip-flop 1200 uses the latch 11 according to the embodiment as a master latch, and includes a slave latch 1200a connected to the latch 11 according to the embodiment in a cascade. The flip-flop 1200 according to the embodiment samples and outputs an input D at a rising edge of the clock like the above-described flip-flop. However, as described above, in the master latch 11, a data storing mode and a restore mode may be performed in a state in which a clock signal CLK is logic high.

According to a memory device and/or a latch according to the embodiment, an advantage in that data can be stored and restored without excessive power consumption, and an advantage in that the data can be stored in a nonvolatile manner are provided. Further, since a relatively small number of transistors are additionally required, an advantage in that a die area is reduced is also provided.

Although the embodiments shown in the drawings are described as a reference for helping understanding of the present disclosure, they are embodiments for implementation, and merely exemplary, and various modifications and equivalents may be performed by those skill in the art. Accordingly, the true technical scope of the present disclosure should be defined by the appended claims.

What is claimed is:

1. A nonvolatile memory device comprising:
a first inverter;
a second inverter cross-coupled to the first inverter; and
a nonvolatile memory circuit,
wherein the nonvolatile memory circuit includes a pull-up transistor, a pull-down transistor, and a ferroelectric field effect transistor (FeFET) of which a first electrode and a second electrode are respectively connected to the pull-up transistor and the pull-down transistor, and
wherein when the ferroelectric field effect transistor is programmed to a low resistance state, an equivalent resistance of a current path including the pull-down transistor is smaller than an equivalent resistance of a current path including the pull-up transistor.

2. The memory device of claim 1, wherein the memory circuit is formed by connecting the pull-up transistor, the ferroelectric field effect transistor, and the pull-down transistor in series from a driving voltage to a ground voltage.

3. The memory device of claim 1, wherein in the ferroelectric field effect transistor, a ferroelectric material layer is formed in a gate stack.

4. The memory device of claim 1, further comprising:
a first transmission gate connected to an input node of the first inverter; and
a second transmission gate connected to an output node of the second inverter and the input node of the first inverter.

5. The memory device of claim 4, wherein a node to which the pull-up transistor and the ferroelectric field effect transistor are connected is connected to the second transmission gate and an output node of the first inverter.

6. The memory device of claim 1, wherein a driving voltage of the memory device is a voltage greater than or equal to a critical voltage of a ferroelectric material layer included in the ferroelectric field effect transistor.

7. The memory device of claim 1, wherein in the memory circuit, the ferroelectric field effect transistor is programmed as an output voltage of the second inverter is provided to one electrode of the ferroelectric field effect transistor, and an output voltage of the first inverter is provided to a gate electrode of the ferroelectric field effect transistor.

8. The memory device of claim 1, wherein:
each of the pull-down transistor and the pull-up transistor is controlled by providing a restore signal and an inversion restore signal to a gate electrode thereof; and
an area of the pull-down transistor is larger than an area of the pull-up transistor.

9. The memory device of claim 8, wherein, in a state in which the ferroelectric field effect transistor is programmed to the low resistance state, when the restore signal is provided to turn on the pull-down transistor, the nonvolatile memory circuit outputs a voltage corresponding to a logic state programmed in the ferroelectric field effect transistor.

10. The memory device of claim 8, wherein, in a state in which the ferroelectric field effect transistor is programmed to a high resistance state, when the restore signal is provided to turn on the pull-up transistor, the nonvolatile memory circuit outputs a voltage corresponding to a logic state programmed in the ferroelectric field effect transistor.

11. The memory device of claim 1, wherein the pull-up transistor is turned on to pre-charge an output node of the nonvolatile memory circuit.

12. The memory device of claim 11, wherein the pull-down transistor is turned on and the nonvolatile memory circuit outputs a voltage corresponding to a logic state programmed in the ferroelectric field effect transistor after the output node is pre-charged.

13. A latch configured to store data in a nonvolatile manner, comprising:
a first inverter;
a second inverter cross-coupled to the first inverter;
a nonvolatile memory circuit including a pull-up transistor, a pull-down transistor, and a ferroelectric field effect transistor of which a first electrode and a second electrode are respectively connected to the pull-up transistor and the pull-down transistor;
a third inverter configured to invert and output an output of the first inverter;
a first transmission gate connected to an input node of the first inverter; and
a second transmission gate connected to an output node of the second inverter and the input node of the first inverter,
wherein when the ferroelectric field effect transistor is programmed to a low resistance state, an equivalent resistance of a current path including the pull-down transistor is smaller than an equivalent resistance of a current path including the pull-up transistor.

14. The latch of claim 13, wherein the memory circuit is formed by connecting the pull-up transistor, the ferroelectric field effect transistor, and the pull-down transistor in series from a driving voltage to a ground voltage.

15. The latch of claim 13, wherein in the ferroelectric field effect transistor, a ferroelectric material layer is formed in a gate stack.

16. The latch of claim 13, wherein a node to which the pull-up transistor and the ferroelectric field effect transistor are connected is connected to the second transmission gate and an output node of the first inverter.

17. The latch of claim 13, wherein a driving voltage of the memory device is a voltage greater than or equal to a critical voltage of a ferroelectric material layer included in the ferroelectric field effect transistor.

18. The latch of claim 13, wherein the memory circuit stores data as an output voltage of the second inverter is provided to one electrode of the ferroelectric field effect transistor, and an output voltage of the first inverter is provided to a gate electrode of the ferroelectric field effect transistor.

19. The latch of claim 13, wherein:
each of the pull-up transistor and the pull-down transistor is controlled by providing a restore signal to a gate electrode thereof; and
an area of the pull-down transistor is larger than an area of the pull-up transistor.

20. The latch of claim 19, wherein, in a state in which the ferroelectric field effect transistor is programmed to the low resistance state, when the restore signal is provided to turn on the pull-down transistor, the nonvolatile memory circuit outputs a voltage corresponding to a logic state programmed in the ferroelectric field effect transistor.

21. The latch of claim 19, wherein, in a state in which the ferroelectric field effect transistor is programmed to a high resistance state, when the restore signal is provided to turn on the pull-up transistor, the nonvolatile memory circuit outputs a voltage corresponding to a logic state programmed in the ferroelectric field effect transistor.

22. The latch of claim 13, wherein the pull-up transistor is turned on to pre-charge an output node of the nonvolatile memory circuit.

23. The latch of claim 22, wherein the pull-down transistor is turned on and the nonvolatile memory circuit outputs a voltage corresponding to a logic state programmed in the ferroelectric field effect transistor after the output node is pre-charged.

24. The latch of claim 13, wherein the latch is included in a flip-flop, and is one of a master latch and a slave latch of the flip-flop.

25. A nonvolatile memory device comprising:
a first inverter; and
a second inverter cross-coupled to the first inverter,
wherein the second inverter includes a pull-up transistor, a pull-down transistor, and a ferroelectric field effect transistor having gate nodes connected to each other, and a restore transistor having one electrode connected to the ferroelectric field effect transistor, and the second inverter stores data in a nonvolatile manner, and
wherein when the ferroelectric field effect transistor is programmed to a low resistance state, a turning-on resistance of a pull-down path including the restore transistor and the ferroelectric field effect transistor is smaller than a turning-on resistance of a pull-up path including the pull-up transistor.

26. The memory device of claim 25, wherein:
a drain of the pull-up transistor and the one electrode of the ferroelectric field effect transistor are connected to each other;
a drain of the pull-down transistor and the other electrode of the ferroelectric field effect transistor are connected to each other;

and a drain of the restore transistor is connected to a node to which the drain of the pull-down transistor and the other electrode of the ferroelectric field effect transistor are connected.

27. The memory device of claim 26, wherein the ferroelectric field effect transistor is programmed to store data as an output voltage of the first inverter is provided to a gate electrode of the ferroelectric field effect transistor, and a voltage in a logic low state from the drain of the pull-down transistor is provided to the other electrode.

28. The memory device of claim 26, wherein the ferroelectric field effect transistor is programmed to store data as an output voltage of the first inverter is provided to a gate electrode of the ferroelectric field effect transistor, and a voltage in a logic high state from the drain of the pull-up transistor is provided to the one electrode.

29. The memory device of claim 25, wherein:
the restore transistor is controlled by providing a restore signal to a gate electrode thereof; and
an area of the restore transistor is larger than an area of the pull-up transistor.

30. The memory device of claim 29, wherein, in a state in which the ferroelectric field effect transistor is programmed to the low resistance state, when the restore signal is provided to turn on the pull-down transistor, the second inverter outputs a voltage corresponding to the programmed state according to a voltage division result of the turning-on resistance of the pull-up path of the pull-up transistor and the turning-on resistance of the pull-down path.

31. The memory device of claim 29, wherein, in a state in which the ferroelectric field effect transistor is programmed to a high resistance state, when the restore signal is provided to turn on the pull-up transistor, the second inverter outputs a voltage in a logic high state provided by the pull-up transistor.

32. The memory device of claim 25, wherein in the ferroelectric field effect transistor, a ferroelectric material layer is formed in a gate stack.

33. The memory device of claim 25, further comprising:
a first transmission gate connected to an input node of the first inverter; and
a second transmission gate having one electrode connected to an output node of the second inverter and the other electrode connected to the input node of the first inverter.

34. The memory device of claim 25, wherein a driving voltage of the memory device is a voltage greater than or equal to a critical voltage of a ferroelectric material layer included in the ferroelectric field effect transistor.

35. A latch configured to store data in a nonvolatile manner, comprising:
a first inverter;
a second inverter including a pull-up transistor, a pull-down transistor, and a ferroelectric field effect transistor having gate nodes connected to each other, and a restore transistor having one electrode connected to the ferroelectric field effect transistor, and cross-coupled to the first inverter;
a first transmission gate connected to an input node of the first inverter;
a second transmission gate having one electrode connected to an output node of the second inverter and the other electrode connected to the input node of the first inverter; and
a third inverter configured to invert and output an output of the first inverter, wherein when the ferroelectric field effect transistor is programmed to a low resistance state, a turning-on resistance of a pull-down path including the restore transistor and the ferroelectric field effect transistor is smaller than a turning-on resistance of a pull-up path including the pull-up transistor.

36. The latch of claim 35, wherein:
a drain of the pull-up transistor and the one electrode of the ferroelectric field effect transistor are connected to each other;
a drain of the pull-down transistor and the other electrode of the ferroelectric field effect transistor are connected to each other; and
a drain of the restore transistor is connected to a node to which the drain of the pull-down transistor and the other electrode of the ferroelectric field effect transistor are connected.

37. The latch of claim 36, wherein the ferroelectric field effect transistor is programmed to store data as an output voltage of the first inverter is provided to a gate electrode of the ferroelectric field effect transistor, and a voltage in a logic low state from the drain of the pull-down transistor is provided to the other electrode.

38. The latch of claim 36, wherein the ferroelectric field effect transistor is programmed to store data as an output voltage of the first inverter is provided to a gate electrode of the ferroelectric field effect transistor, and a voltage in a logic high state from the drain of the pull-up transistor is provided to the one electrode.

39. The latch of claim 35, wherein:
the restore transistor is controlled by providing a restore signal to a gate electrode thereof; and
an area of the restore transistor is larger than an area of the pull-up transistor.

40. The latch of claim 39, wherein, in a state in which the ferroelectric field effect transistor is programmed to the low resistance state, when the restore signal is provided to turn on the restore transistor, the second inverter outputs a voltage corresponding to the programmed state according to a voltage division result of the turning-on resistance of a pull-up path of the pull-up transistor and the turning-on resistance of the pull-down path.

41. The latch of claim 39, wherein, in a state in which the ferroelectric field effect transistor is programmed to a high resistance state, when the restore signal is provided to turn on the restore transistor, the second inverter outputs a voltage in a logic high state provided by the pull-up transistor.

42. The latch of claim 35, wherein in the ferroelectric field effect transistor, a ferroelectric material layer is formed in a gate stack.

43. The latch of claim 35, wherein a driving voltage of the second inverter is a voltage greater than or equal to a critical voltage of a ferroelectric material layer included in the ferroelectric field effect transistor.

44. The latch of claim 35, wherein the latch is included in a flip-flop, and is one of a master latch and a slave latch of the flip-flop.

* * * * *